(12) United States Patent
Rangan et al.

(10) Patent No.: US 11,107,523 B1
(45) Date of Patent: Aug. 31, 2021

(54) MULTI-LEVEL CELL (MLC) CROSS-POINT MEMORY

(71) Applicant: Intel Corporation, Santa Clara, CA (US)

(72) Inventors: Sanjay Rangan, Albuquerque, NM (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/828,589

(22) Filed: Mar. 24, 2020

(51) Int. Cl.
| | |
|---|---|
| *G11C 11/00* | (2006.01) |
| *G11C 11/56* | (2006.01) |
| *G11C 13/00* | (2006.01) |

(52) U.S. Cl.
CPC ........ *G11C 11/5678* (2013.01); *G11C 13/003* (2013.01); *G11C 13/0004* (2013.01); *G11C 13/004* (2013.01); *G11C 13/0069* (2013.01); *G11C 2013/0045* (2013.01); *G11C 2013/0078* (2013.01); *G11C 2213/15* (2013.01); *G11C 2213/30* (2013.01)

(58) Field of Classification Search
CPC ............ G11C 11/5678; G11C 13/0004; G11C 13/004; G11C 13/003
USPC ........................................................ 365/163
See application file for complete search history.

(56) References Cited

U.S. PATENT DOCUMENTS

| | | | |
|---|---|---|---|
| 2011/0286258 A1 | 11/2011 | Chen et al. | |
| 2018/0040370 A1 | 2/2018 | Tortorelli et al. | |
| 2019/0189206 A1* | 6/2019 | Tortorelli | G11C 13/0004 |
| 2019/0245136 A1* | 8/2019 | Choi | H01L 43/12 |
| 2019/0378568 A1* | 12/2019 | Robustelli | G11C 13/0069 |

OTHER PUBLICATIONS

Extended European Search Report for Patent Application No. 20207071.0, dated Apr. 16, 2021, 9 pages.

* cited by examiner

*Primary Examiner* — Vu A Le
(74) *Attorney, Agent, or Firm* — Compass IP Law, PC

(57) ABSTRACT

Multi-level cell (MLC) cross-point memory cells can store more than 1 bit per cell. In one example, MLC write operations for cross-point memory can be achieved by independently changing the state of the switch element and the memory element. The memory cell can be programmed to multiple states, such as a high threshold voltage state (where both the memory element and switch element exhibit a high threshold voltage or resistance), a low threshold voltage state (where both the memory element and select element exhibit a low threshold voltage or resistance), and one or more intermediate resistance states. In one example, additional resistance states can be programmed by setting the switch element and memory element to opposite states (e.g., one of the switch element and memory element is in a high resistance state and the other is in a low resistance state) or by placing both the switch element and memory element in different intermediate states.

22 Claims, 16 Drawing Sheets

— 200A

| Row | Type | Select device/switch element state | Memory element state | Bit info |
|---|---|---|---|---|
| 1 | 1 bit/cell (set) | Set (low resistance) | Set (low resistance) | 1 |
| 2 | 1 bit/cell (reset) | Reset (high resistance) | Reset (high resistance) | 0 |
| 3 | 1.5 bit/cell (L0) | Set (low resistance) | Set (low resistance) | 11 |
| 4 | 1.5 bit/cell (L1) option 1 | Set (low resistance) | Reset (high resistance) | 10 |
| 5 | 1.5 bit/cell (L1) option 2 | Set (intermediate resistance) | Reset (intermediate resistance) | 10 |
| 6 | 1.5 bit/cell (L3) | Reset (high resistance) | Reset (high resistance) | 00 |

— 200A

| Row | Type | Select device/switch element state | Memory element state | Bit info |
|---|---|---|---|---|
| 1 | 1 bit/cell (set) | Set (low resistance) | Set (low resistance) | 1 |
| 2 | 1 bit/cell (reset) | Reset (high resistance) | Reset (high resistance) | 0 |
| 3 | 1.5 bit/cell (L0) | Set (low resistance) | Set (low resistance) | 11 |
| 4 | 1.5 bit/cell (L1) option 1 | Set (low resistance) | Reset (high resistance) | 10 |
| 5 | 1.5 bit/cell (L1) option 2 | Set (intermediate resistance) | Reset (intermediate resistance) | 10 |
| 6 | 1.5 bit/cell (L3) | Reset (high resistance) | Reset (high resistance) | 00 |

| Row | Type | Select device/switch element state | Memory element state | Bit info |
|---|---|---|---|---|
| 1 | 1 bit/cell (set) | Set (low resistance) | Set (low resistance) | 1 |
| 2 | 1 bit/cell (reset) | Reset (high resistance) | Reset (high resistance) | 0 |
| 3 | 2 bit/cell (L0) | Set (low resistance) | Set (low resistance) | 11 |
| 4 | 2 bit/cell (L1) option 1 | Set (low resistance) | Reset (high resistance) | 10 |
| 5 | 2 bit/cell (L1) option 2 | Set (intermediate resistance 1) | Reset (intermediate resistance 1) | 10 |
| 6 | 2 bit/cell (L2) option 1 | Reset (high resistance) | Set (low resistance) | 01 |
| 7 | 2 bit/cell (L2) option 2 | Set (intermediate resistance 2) | Reset (intermediate resistance 2) | 01 |
| 8 | 2 bit/cell (L3) | Reset (high resistance) | Reset (high resistance) | 00 |

FIG. 2B

MULTI-LEVEL CELL (MLC) CROSS-POINT MEMORY

FIELD

The descriptions are generally related to memory, and more particularly, to techniques for accessing multi-level cell (MLC) cross-point memory.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 2A and 2B are tables illustrating examples of multi-bit encoding for cross-point memory.

Figure 1:
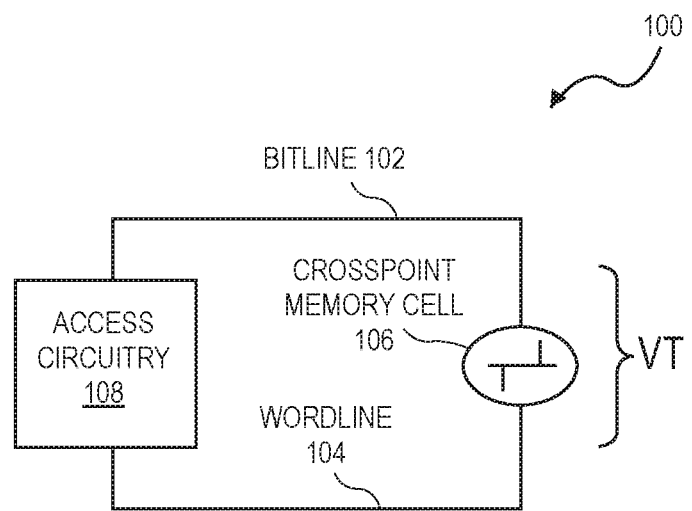
FIG. 1 is an example of a memory cell.

Descriptions of certain details and implementations follow, including a description of the figures, which may depict some or all of the embodiments described below, as well as discussing other potential embodiments or implementations of the inventive concepts presented herein.

DETAILED DESCRIPTION

Multi-level cell (MLC) cross-point memory is described.

Conventional cross-point memories include memory cells that are programmable to one of two states to store one bit. In contrast to conventional cross-point memory, an MLC cross-point memory includes cells that can store more than one bit (e.g., 1.5 bits, 2 bits, or more). For example, a 2-bit memory cell is programmable to one of four states. A 1.5-bit memory cell is programmable to one of three states. Storing more than one bit per cell has the benefit of higher memory density (number of bits/area); however, prior attempts at enabling MLC cross-point memory have been unworkable due to a number of factors such as material drift, manufacturing challenges, read disturb issues, etc.

For example, one approach to MLC cross-point memory involves a "switch-only" or "self-selecting" memory cell in which the switch element behaves as both an access device as well as a memory element. However, a switch-only approach is typically a bipolar design in which the cell is written with biases that are switched or reversed (e.g., the polarity of the voltage/current to write the memory cell is changed depending on the desired state). Bipolar designs typically require additional circuitry, resulting in a larger chip area. Additionally, switch-only cells may have an increased risk regarding cell stability as a function of the number of reads.

Another approach to MLC involves using only the memory element to store the different bits. However, only using the memory element (and not the switch element) typically requires a large memory window, which introduces process challenges. Additionally, an approach that only uses the memory element to store the different states typically uses large select devices (e.g., diodes or transistors), resulting in an inefficient use of space on the die.

In contrast, using both the switch element and the memory element to create multiple states can increase memory density, resulting in an decrease in cost/bit, without some of the challenges discussed above. Write and read algorithms enable independently modulating the memory effect of the switch and the memory element through a unipolar pulse architecture. In one example, the resistance state of the memory element and the resistance state of switch element are independently set to achieve more than two states per memory cell. In one state (e.g., L0), both the memory element and the switch element are in a low resistance state. In another state (e.g., L3), both the memory element and the switch element are in a high resistance state. In one or more additional states, the memory cell is in an intermediate resistance state. Intermediate resistance states can be achieved by placing the memory element and switch element in opposite states (e.g., the memory element is in a high resistance state while the switch element is in a low resistance state). Another way to achieve an intermediate state is to place the memory element and switch element in intermediate resistance states that are between the low and high resistance states.

FIG. 1 is circuit diagram of an example of a two-terminal cross-point memory cell that can be accessed as a multi-level cell. The cross-point memory cell is one of many memory cells in a cross-point memory device. The cross-point memory cell 106 is coupled with access circuitry via a bitline 102 and a wordline 104. The cross-point memory cell 106 includes one or more materials to store one or more bits. The cross-point memory cell 106 can include a memory element and a switch element. The memory element can store information by being placed in one of multiple states (e.g., resistive or resistance states). The memory element of the cross-point memory cell 106 can include any memory element with a tunable threshold voltage. The switch element enables selection of the memory cell, and thus may also be referred to as a select device. The switch element can also be placed in one of multiple states (e.g., resistive or resistance states). In one example, the memory element and switch element can be independently placed in different resistive states to enable the memory cell to store more than 1 bit.

In one example, each resistive state of the memory element and the switch element is associated with a different threshold voltage (VT). A threshold voltage is a voltage at which the element (e.g., memory element or switch element) undergoes a change (e.g., a physical change) that causes the cell to be in a higher conductive state. The threshold voltage of the memory cell is based on the threshold voltage of both the memory element and the switch element. In one example, a memory cell can be said to "threshold" or undergo a "threshold event." In one example, when a memory cell thresholds (e.g., in response to an applied voltage with a magnitude greater than the threshold voltage at the current state), the switch element, memory element, or both, undergo a physical change that causes the memory cell to exhibit a certain electrical characteristics, such as high conductivity. Once a cell thresholds, a program current of a particular amplitude, polarity, and duration can be applied to the cell to cause the cell to be in the desired resistive state. The value stored by the cross-point memory cell 106 can therefore be determined by detecting the resistive state of the cell, which can be determined by detecting the current that flows through the cell in response to one or more applied voltages.

The memory cell 106 is coupled with circuitry 108 to enable access to and operation of the memory cell 106. The circuitry includes electronic components that are electrically coupled to perform one or more of: supplying voltages to the memory cell, sensing electrical responses of the memory cell, performing analog or logic operations on received or stored information, outputting information, and storing information. In one example, the access circuitry 108 includes circuitry to select memory cells, write to memory cells, and read from memory cells.

As mentioned above, both the memory element and the switch element can be placed independently in different resistance states to write a multi-bit value to the memory cell. For example, the circuitry 108 can independently set a state of the memory element and a state of the switch element of a cross-point memory cell of the array to program the cross-point memory cell to one of multiple logic values, including a first logic value corresponding to a low magnitude threshold voltage, a second logic value corresponding to a high magnitude threshold voltage, and at least a third logic value corresponding to an intermediate threshold voltage.

FIGS. 2A and 2B are tables illustrating examples of multi-bit encoding for cross-point memory using both the switch element and the memory element. FIG. 2A illustrates an example of 1.5-bit per cell encoding. FIG. 2B illustrates an example of 2-bit per cell encoding. The first column of the tables 200A and 200B illustrates the type of cell (e.g., 1 bit/cell, 1.5 bit/cell, or 2 bit/cell). The second column illustrates the switch element or switch element state. The third column illustrates the memory element state. The switch element and memory element can be in a low resistance state, a high resistance state, or an intermediate resistance state. The resistance states can also be referred to as resistive or conductive states in which the memory element and/or switch element exhibit different resistivities, conductivities, and/or threshold voltages. Note that a high resistance state of a memory element may be different than a high resistance state of a switch element, a low resistance state of a memory element may be different than a low resistance state of a switch element, and so forth. There may be more than one intermediate resistance state (e.g., lower and higher intermediate states). Although only two intermediate resistance states are shown, more than two intermediate resistance states are possible. The fourth column shows the bit info (e.g., logic-value) associated with the switch element and memory element states. For comparison, the first two rows of the tables 200A and 200B illustrate example encoding for a single bit memory cell. Note that the encodings in FIGS. 2A and 2B are examples; other encodings are possible (e.g., the L0 state can refer to a different logic value such as 00b).

Referring first to FIG. 2A, the table illustrates an example in which the memory cell can be in one or three states: L0, L1, and L3. In the illustrated example, L0 corresponds to a logic value of 11, L1 corresponds to a logic value of 10, and L3 corresponds to a logic value of 00. Thus, table 200A illustrates an example in which L2 is omitted, and therefore the memory cell can be in one of three states and store 1.5 bits (more information than 1 bit, but not two full bits). The L0 and L3 states are similar to the "set" and "reset" states respectively because both the switch element and the memory element are in the same resistive state. For example, when both the switch element and the memory element are in a low resistance state, the memory cell is in the L0 state. When both the switch element and the memory element are in a high resistance state, the memory cell is in an L3 state.

Unlike in conventional cross-point memories, the table 200A illustrates examples of how a memory cell can be in a third state, L1, which corresponds to a third logic value (e.g., 10). In the example illustrated in FIG. 2A, there are two ways illustrated to achieve the L1 state. Row four of the table 200A shows an example L1 state in which the switch element and the memory element are in opposite resistive states. Specifically, the switch element is in a low resistance state and the memory element is in a high resistance state. Row five of the table 200A shows another example L1 state in which both the switch element and the memory element are in intermediate resistance states. An intermediate resistance state is a state in which the switch element and/or memory element exhibit a resistance that is greater than when in the low resistance state and less than when in the high resistance state.

FIG. 2B illustrates an example in which the memory cell can be in one of four states: L0, L1, L2, and L3. The states L0, L1, and L3 in table 200B are the same as in the table 200A of FIG. 2A. Therefore, rows 3-5 of the table 200B are the same as rows 3-5 of table 200A and row 8 of table 200B is the same as row 6 of table 200A. However, the example in FIG. 2B differs from FIG. 2A in that the table 200B illustrates an additional state, L2. Like L1, there are two ways illustrated to achieve the L2 state. Row six of the table 200B shows an example L2 state in which the switch element and the memory element are in opposite resistive states. Specifically, the switch element is in a high resistance state and the memory element is in a low resistance state. However, as mentioned above, the encoding could be different. For example, the memory element could be in the set state in L1 and the switch element could be in the reset state in L1. In one such example, the memory element could be in the reset state in L2 and the switch element could be in the set state in L2. Regardless of encoding, in these examples, one of the two elements (switch element and memory element) are in the reset state and the other is in the set state for L1 and L2.

Row seven of the table 200B shows another example L2 state in which both the switch element and the memory element are in intermediate resistance states. In an example in which both L1 and L2 represent intermediate resistance states of the memory element and switch element, L1 and L2 represent different intermediate resistances. For example, L1 may represent a lower intermediate resistance state and L2 may represent a higher intermediate resistance state, or vice versa. Note that different encoding schemes may include all variations possible in the tables 200A and 200B. For example, an encoding scheme that includes option 1 for L1 may include either option 1 or option 2 for L2. Similarly, an encoding scheme that includes option 2 for L1 may include either option 1 or option 2 for L2.

Figure 3A:
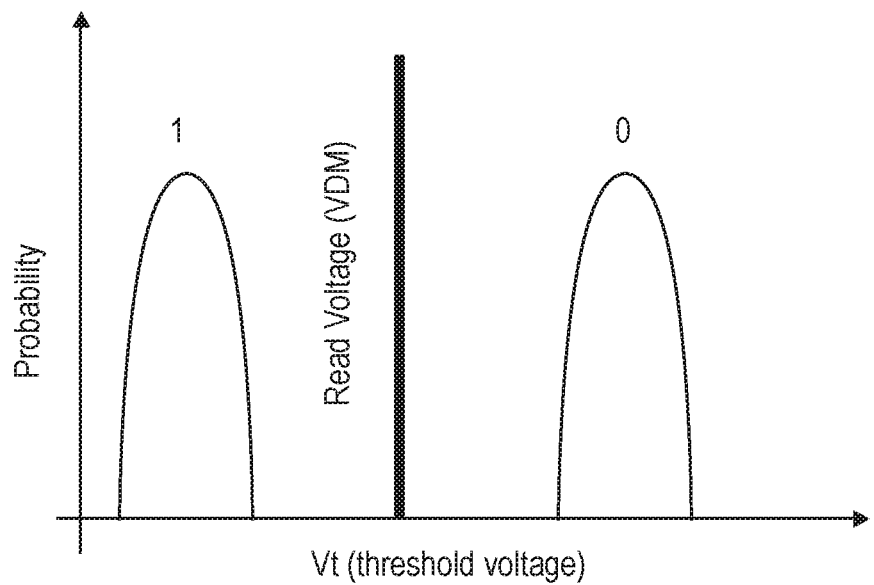
FIG. 3A illustrates an example of threshold voltage distributions of single level cross-point cells.
Figure 3B:
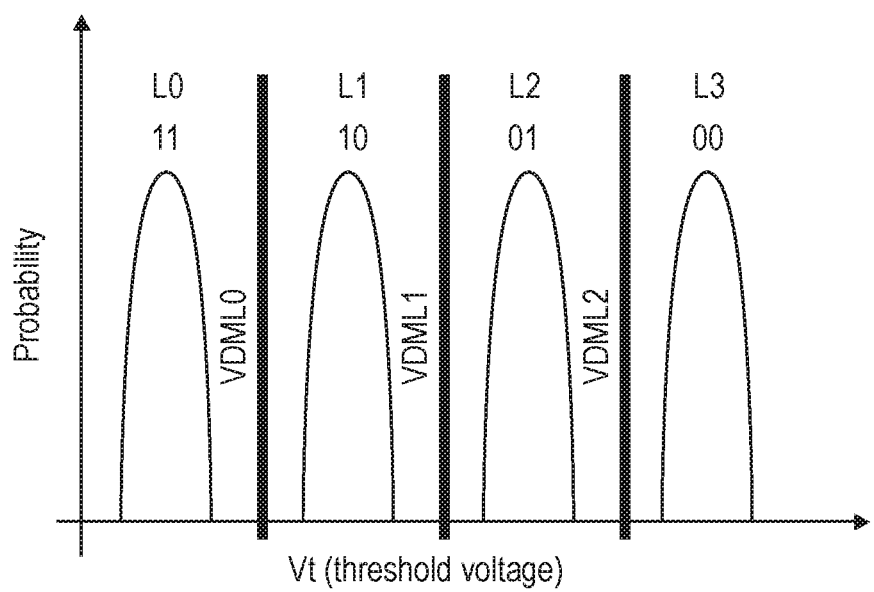
FIG. 3B illustrates an example of threshold voltage distributions of multi-level cross-point cells.

FIGS. 3A and 3B illustrate an example of threshold voltage distributions of a single level cross-point cells and a multi-level cross-point cells, respectively. FIG. 3A shows threshold voltage distributions for set (e.g., logic 1) and reset (e.g., logic 0) states, which correspond to rows one and two in the tables 200A and 200B, discussed above. A read (demarcation) voltage VDM is between the threshold voltage distributions for the set and reset states to enable differentiating between the states during a read operation. Application of VDM across memory cells causes memory cells in the set state to threshold, and memory cells in the reset state to not threshold.

FIG. 3B shows threshold voltage distributions for four states (e.g., L0, L1, L2, and L3) corresponding to four logic values (11, 10, 01, and 00). The states L0, L1, L2, and L3 correspond to rows 3-8 in the table 200B, discussed above. Three different demarcation or read voltages are between adjacent threshold voltage distributions. For example, VDML0 is between the L0 and L1 distributions. VDM1 is between the L1 and L2 distributions. VDM2 is between the L2 and L3 distributions. To enable more than two states, the memory element and switch element are separately placed (e.g., independently put into different resistive states), unlike the conventional 1-bit cell. The multiple states can be achieved via write algorithms, such as the write algorithms described with respect to FIGS. 4A-4H, discussed below.

FIGS. 4A-4H illustrate examples of current waveforms in which the memory element is a phase change memory (PCM) element, and the switch element can be placed in one of multiple (e.g., 2) states. The current waveforms shown in FIGS. 4A-4H and the corresponding description assume the bit-encoding shown in FIGS. 2A, 2B, and 3B. However, the same techniques apply to different bit-encoding schemes. Note that the current waveforms of FIGS. 4A-4H illustrate pulses having various magnitudes and durations. The current pulses are generated and applied to the memory cell (e.g., a current passes through the memory cell). Applying a current can involve applying a pulse or pulses or otherwise causing a current to pass through the memory cell. A current pulse is typically a rapid and transient change (e.g., increase or decrease) in voltage or current, respectively. For example, a current pulse may be defined as a rapid change from a first current level to a second current level, followed by a rapid return to the first current level (or a transition to a different current level). Pulses can have a variety of durations and shapes, such as rectangular, triangular, or other shapes. The examples illustrated in FIGS. 4A-4H are rectangular pulses, however, other pulse shapes may also be used to write to MLC cross-point cells. A waveform with multiple current levels (such as the waveform in FIG. 4A) may be referred to as a pulse or multiple pulses.

Figure 4A:
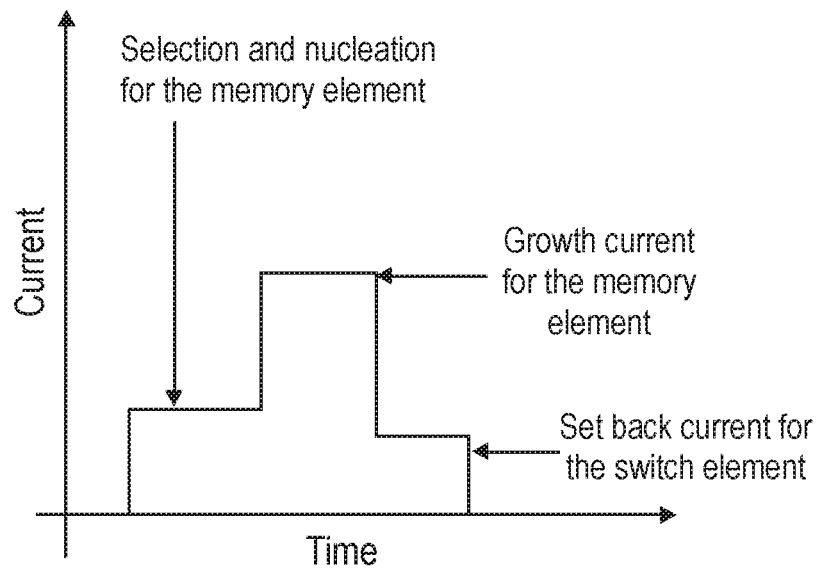
FIGS. 4A-4H illustrate examples of current waveforms for writing to MLC cross-point memory cells.
Figure 4B:
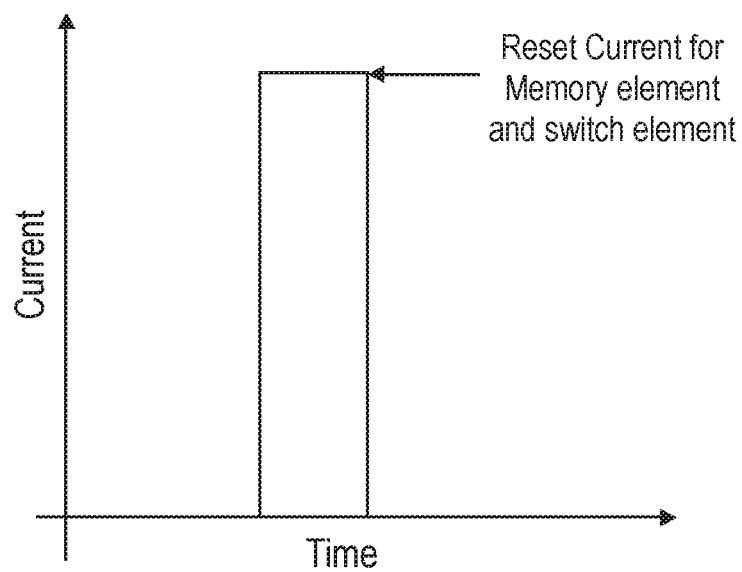

FIGS. 4A and 4B illustrate examples of current waveforms to enable state 00 (e.g., state L0) and state 11 (e.g., state L3), respectively. The L0 state can be programmed with a current waveform for a set cell in a typical 1-bit per cell scheme. For example, the set state can be achieved by setting the memory element to a low resistance state by crystallizing the memory element and further setting back the switch element to a low Vt/low resistance state. The current waveform in FIG. 4A includes a selection and nucleation current followed by a higher magnitude growth current. After the growth current to place the memory element in the low resistance state, a set back current is applied to bring the switch element to the low resistance state. As depicted in FIG. 4B, the high resistance reset state can be achieved by amorphizing the memory element with a high magnitude reset current (e.g., RESET), which also places the switch element to a high Vt/high resistance state. Note that although a selection current is not shown before the reset current in FIG. 4B, a selection current such as in FIG. 4A will typically be applied prior to the reset current.

Figure 4C:
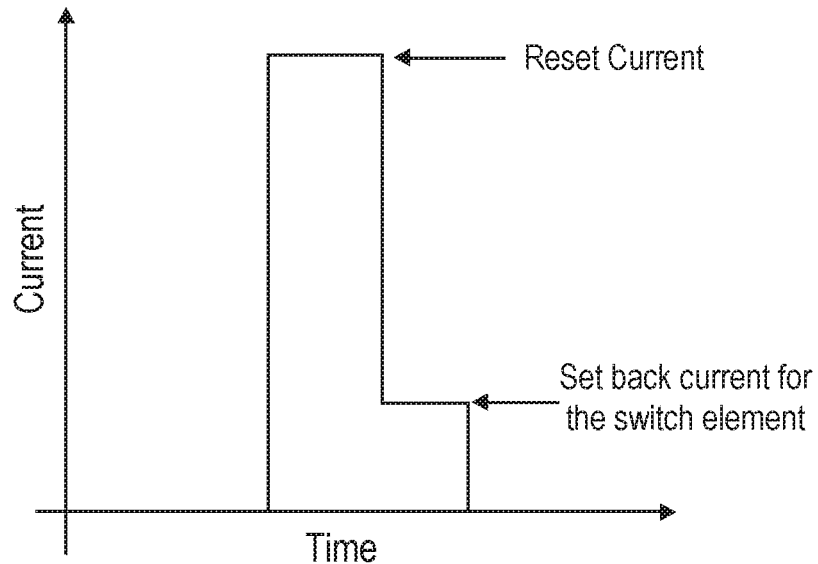
Figure 4D:
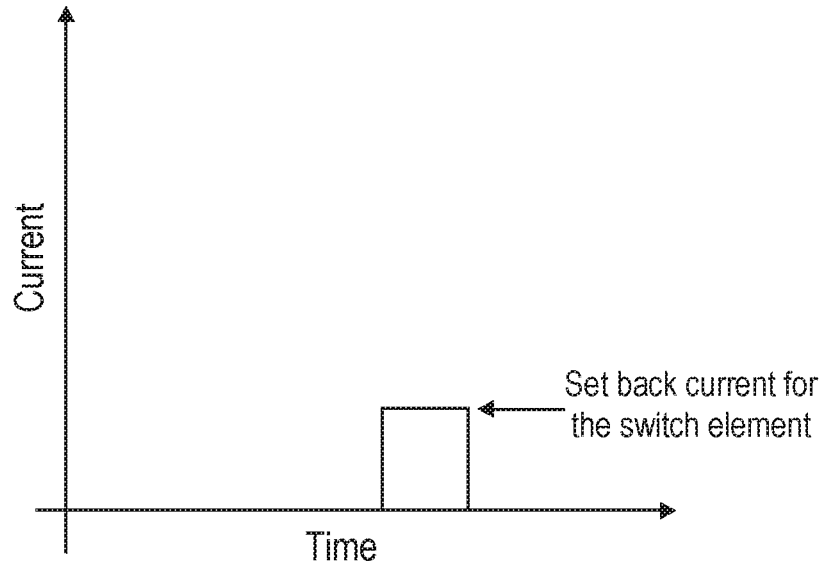

FIGS. 4C-4H illustrate examples of waveforms for enabling additional states besides the typical set and reset state. FIGS. 4C and 4D illustrate examples of current waveforms to enable state 10 (e.g., state L1 option 1), corresponding to row four of the table 200B of FIG. 2B. FIG. 4C illustrates a waveform to cause a memory cell to be written from state 11 (L0) or state 01 (L2, option 1) to state 10 (L1, option 1). Thus, referring to FIG. 4C, the state prior to the write operation is L0 or L2, and the state after the write operation completes is L1. The memory element of the memory cell prior to the write operation is therefore in a set or low resistance state, and the memory element after the write operation completes is to be in the reset or high resistance state. Depending on whether the starting state is L0 or L2, the switch element may be in a set or reset state prior to the write operation. The switch element after the write operation completes is in a reset state.

In the example of FIG. 4C, both the memory element and the switch element are placed into a high resistance (reset) state with a reset current and then the switch element is set back to a low resistance (set) state using a low current short pulse (set back current) after the reset current. In one example, the resistance state of the memory element is determined prior to programming (e.g., with a read operation). If the memory element is in a low resistance state, a current to cause the memory element to be in a high resistance state is applied prior to the set back current for the switch element. The high magnitude reset current causes both the switch element and the memory element to be in a high resistance (reset) state. After a determination that the memory element is in the high resistance state (due to a read operation and/or the reset current pulse of the write waveform shown in FIG. 4C), a current (e.g., the set back current) is applied to the memory cell to cause the switch element to be in the low resistance state. The lower magnitude set-back current causes only the switch element to transition from a high resistance state to a low resistance state. In one example, pulse time and current magnitude for the set back is critical due to the potential to disturb the memory element, which is in the reset state. In one such example, the set-back pulse has a magnitude and duration that prevents nucleation of the memory element (e.g., the memory element does not begin the phase transition from amorphous to crystalline state) and places the switch element in the low resistance state.

Thus, the duration of the set-back current is less than the nucleation time of the memory element and the set-back current magnitude is less than or equal to the nucleation current magnitude of the memory element. Note that although a selection current is not shown before the reset current in FIG. 4C, a selection current such as in FIG. 4A will typically be applied prior to the reset current.

FIG. 4D illustrates an example of a waveform in which the memory cell transitions from state 00 (L3) to state 10 (L1, option 1). In the example of FIG. 4D, the memory element is already in a high resistance state (see, row eight of the table 200B of FIG. 2B). Therefore, only the switch element's state is changed from a high resistance state to a low resistance state. In order to change the switch element to a low resistance state, only the set back pulse is needed, which may have the same constraints defined above in terms of memory element disturb. For example, the set-back pulse of FIG. 4D has a duration that is less than the nucleation time of the memory element and a magnitude that is less than or equal to the nucleation current magnitude of the memory element. However, to mitigate the risk from nucleation occurring during the selection portion of the algorithm, the same write algorithm as shown in FIG. 4C can also be used to change the memory cell from state 00 to state 10. Note that although a selection current is not shown before the set back current in FIG. 4D, a selection current such as in FIG. 4A will typically be applied prior to the reset current.

Figure 4E:
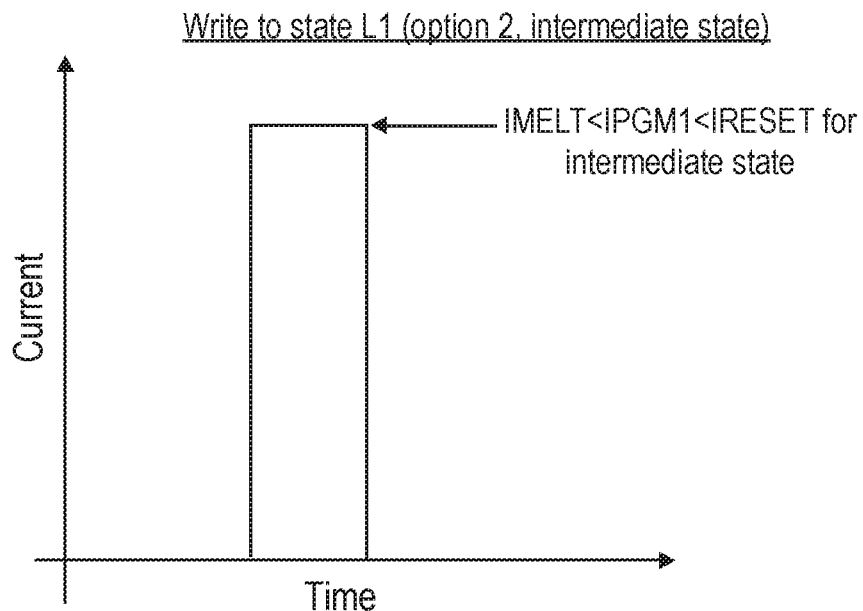

FIG. 4E illustrates an example of a current waveform in which the memory cell is programmed to an intermediate state 10 (L1 option 2), corresponding to row five of the tables 200A and 200B. The option 2 algorithm for state 10 places both the memory element and the switch element into an intermediate resistance state with a current pulse having a magnitude of IPGM1. The current IPGM1 is an intermediate current with a magnitude that is lower than the reset current (RESET) used to program the reset state 00 and greater than the current magnitude at which the phase change material begins to melt (e.g., IMELT). Note that although a selection current is not shown before the reset current in FIG. 4E, a selection current such as in FIG. 4A will typically be applied prior to the intermediate IPGM1 current.

Figure 4F:
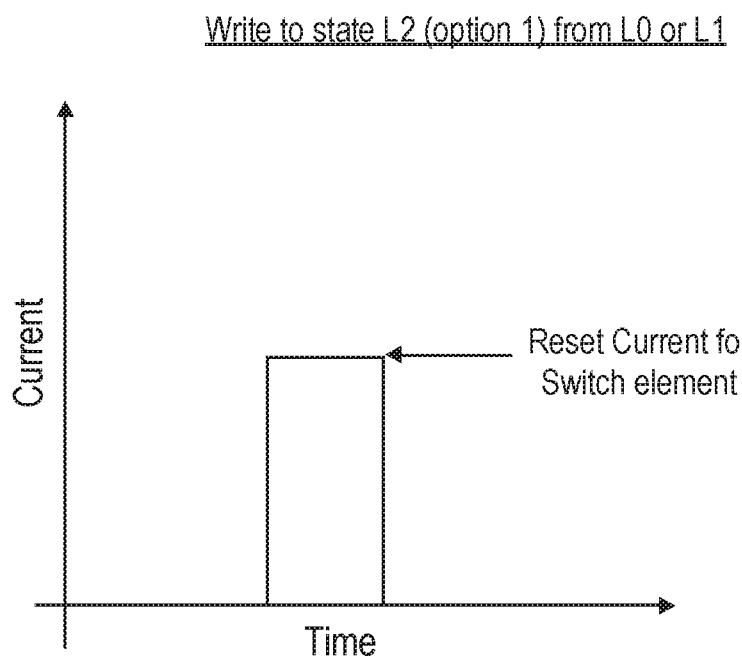
Figure 4G:
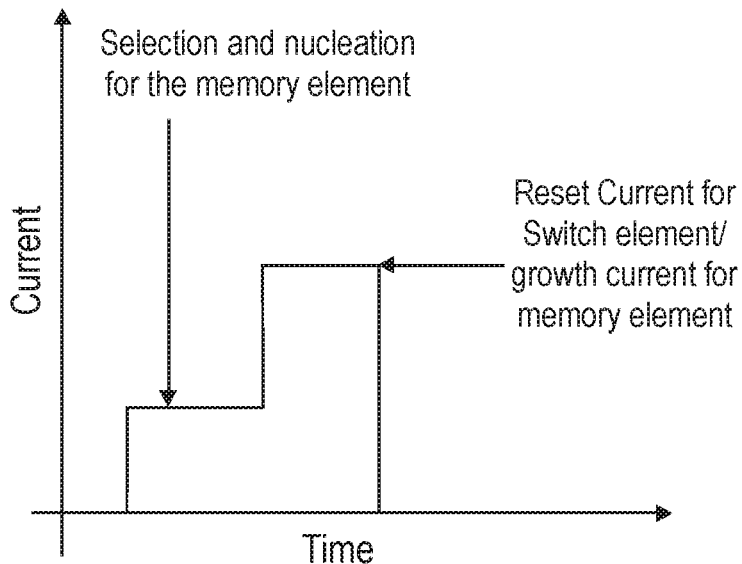

FIGS. 4F and 4G illustrate examples of current waveforms to enable state 01 (e.g., state L2 option 1), corresponding to row six of the table 200B of FIG. 2B. FIG. 4F illustrates a waveform to cause a memory cell to be written from state 11 (L0) to state 01 (L2, option 1). Thus, the state prior to the write operation is L0, and the state after the write operation completes is L2. The memory element of the memory cell prior to the write operation is therefore in a set or low resistance state, and the memory element after the write operation completes is to be in a low resistance state. Therefore, there is no change in the state of the memory element when transitioning from L0 to L2. The switch element prior to the write operation is in a set or low resistance state, and the switch element after completion of the write operation is in a reset or high resistance state. Therefore, there is a change in the state of the switch element when transitioning from L0 to L2.

In the example in FIG. 4F, the algorithm involves a short time pulse with a reset current for the switch that is less than or equal to IMELT (the melt current of the memory element). By applying a current with a magnitude that is less than or equal to IMELT ensures that the memory element does not get disturbed. Note that although a selection current is not shown before the reset current for the switch element in FIG. 4F, a selection current such as in FIG. 4A will typically be applied prior to the reset current.

FIG. 4G illustrates an example of a waveform to cause a memory cell to be written from state 10 (L1, option 1) or state 00 (L3). Thus, the state prior to the write operation is L1 or L3, and the state after the write operation completes is L2. The memory element of the memory cell prior to the write operation is therefore in a reset or high resistance state, and the memory element after the write operation completes is to be in a low resistance state. The switch element prior to the write operation is in a set or reset state, depending on whether the starting state is L1 or L3. The switch element after completion of the write operation is in a reset or high resistance state.

In the example of FIG. 4G, the algorithm causes a phase transition of the memory element from amorphous to crystalline in addition to placing the switch element in a high resistance state. In one example, the resistance state of the memory element is determined prior to programming. If the memory element is in a low resistance state prior to programming, the lower magnitude nucleation current is applied prior to the reset current for the switch element. The pulse algorithm in FIG. 4G stops the set pulse at the end of growth of the memory element without a set back current for the switch element.

Figure 4H:
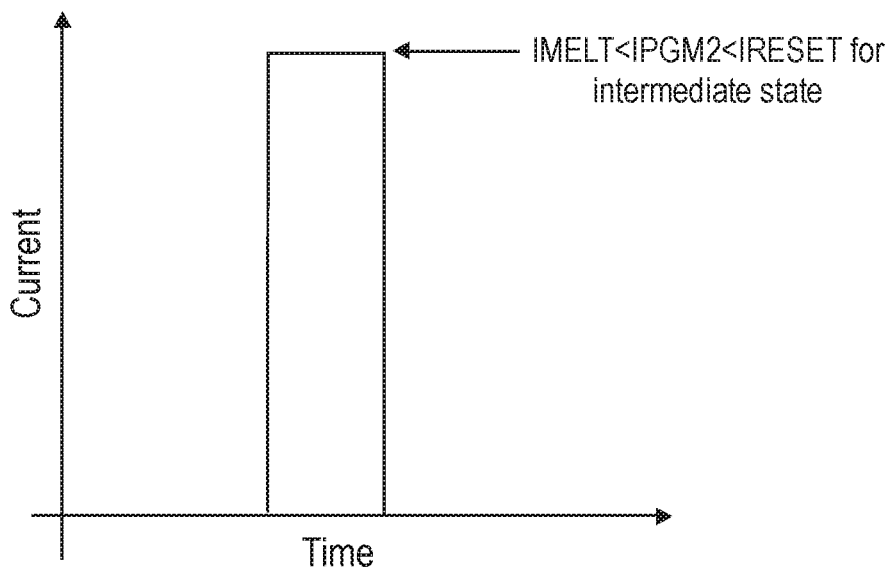

FIG. 4H illustrates an example of a current waveform in which the memory cell is programmed to an intermediate state 01 (L2 option 2), corresponding to row seven of the table 200B. The waveform of FIG. 4F for state 01 places both the memory element and the switch element into a higher intermediate resistance state with an intermediate current IPGM2. In one example, the magnitude of IPGM2 is lower than the magnitude of IRESET and higher than the magnitude of IPGM1 used to program the state 10. Thus, the magnitude of IPGM2 is also greater than the magnitude of IMELT. As explained in more detail below, the same algorithm can be used for the reading the state 01 (option 2), thereby ensuring the bit remains undisturbed post read with the built-in write during the read operation. Note that although a selection current is not shown before the intermediate IPGM2 current in FIG. 4H, a selection current such as in FIG. 4A will typically be applied prior to the IPGM2 current.

Thus, MLC write operations for cross-point memory can be achieved by independently changing the state of the switch element and the memory element. Additional states L1 and L2 can be programmed by setting the switch element and memory element to opposite states (e.g., one of the switch element and memory element is in a high resistance state and the other is in a low resistance state) or by placing both the switch element and memory element in different intermediate states.

Programming the MLC cross-point memory cells involves delivering current pulses to the memory cells at particular magnitudes to place the switch element and memory element in the desired states, as discussed above with respect to the examples of FIGS. 4A-4F.

Figure 5:
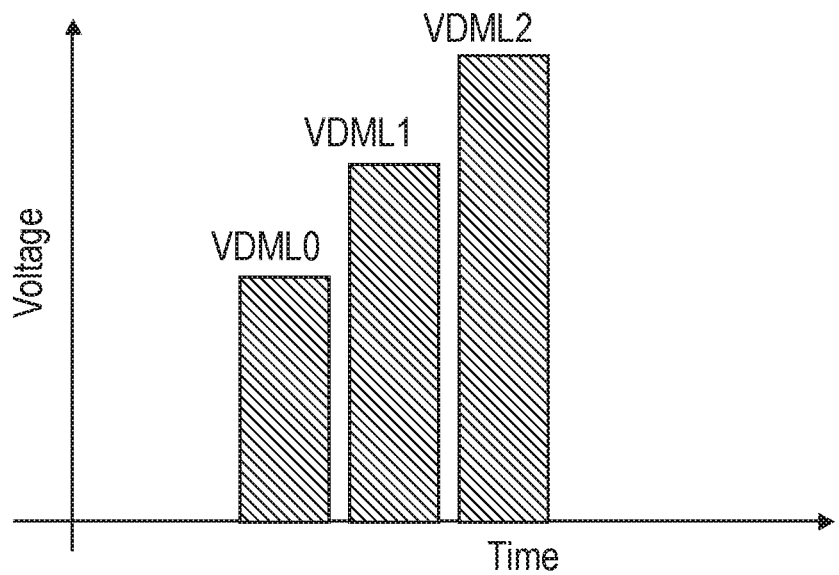
FIG. 5 illustrates an example of multiple read voltages for reading from MLC cross-point memory cells.

Reading a multi-level cell (MLC) involves applying a voltage across the cell to select the cell, detecting an electrical response in response to the voltage, and applying a current through the cell. Applying a voltage across the cell can involve generating a voltage pulse, which is typically a rapid and transient change (e.g., increase or decrease) in voltage. For example, a voltage pulse may be defined as a rapid change from a first voltage level to a second voltage level, followed by a rapid return to the first voltage level (or a transition to a different voltage). Voltage pulses can have a variety of durations and shapes, such as rectangular, triangular, or other shapes. FIG. 5 illustrates an example of multiple read or demarcation voltages for performing a read operation. The demarcation voltages VDML0, VDML1, and VDML2 correspond to the demarcation voltages described above with respect to FIG. 3B.

In the example in FIG. 5, the demarcation voltages are applied across the memory cell in the order from lowest magnitude (VDML0) to highest magnitude (VDML2). If the memory cell thresholds in response to the application of VDML0, then the memory cell is in the L0 state and the read operation can complete without applying VDML1 and VDML2. If the memory cell does not threshold, then VDML1 is applied across the memory cell. If the memory cell thresholds in response to the application of VDML1, then the memory cell is in the L1 state, and the read operation can be completed without applying VDML2. If the memory cell does not threshold in response to the application of VDML0 and VDML1, then VDML2 is applied across the memory cell. If the memory cell thresholds in response to the application of VDML2, then the memory cell is in the L2 state. If the memory cell does not threshold in response to VDML2, then the memory cell is in the L3 state.

In each case, after applying the demarcation voltage across the memory cell, current is delivered to the memory cell. FIGS. 6A-6F illustrate examples of state-dependent current waveforms for performing read operations.

Figure 6A:
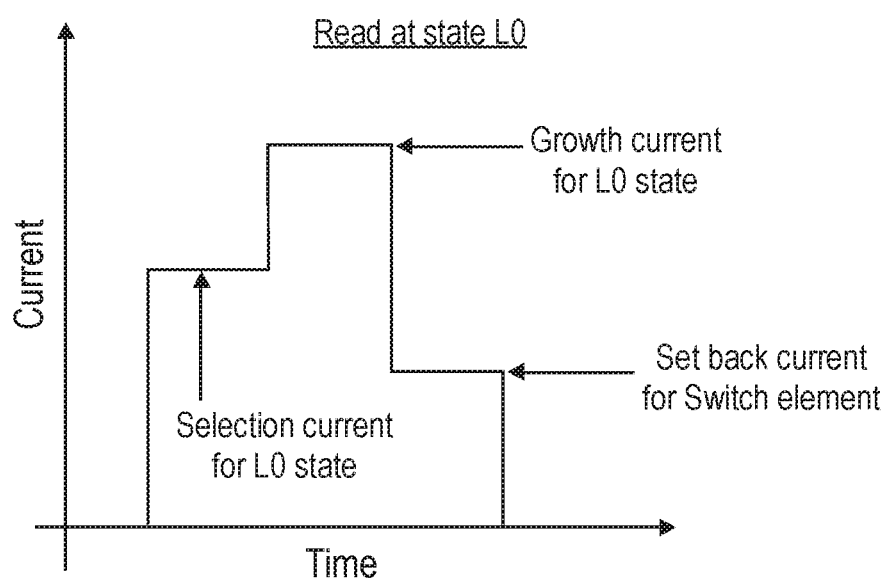
FIGS. 6A-6G illustrate examples of a current waveforms for reading from MLC cross-point memory cells.

FIG. 6A illustrates an example of a current waveform for a read operation of a memory cell in the L0 state. In this example, the L0 state corresponds to both the switch element and the memory element being in a low resistance state. The waveform in FIG. 6A includes a selection current for the L0 state. The selection current is applied to the memory cell starting prior to the thresholding of the memory cell. The selection current charges the wordline and bitline, and when the memory cell thresholds, the current from the wordline and bitline cause a transient current surge through the memory cell. The selection current is applied after the thresholding of the memory cell and after the selection current spike to stabilize current through the cell. The selection current is based in part on the select or read voltage (here, VDML0) that is applied across the memory cell. Typically, the sensing operation is performed during this phase of the read operation. After the selection current, a growth current is applied to the memory cell to put the memory cell into the low resistance state and correct any read disturb of the memory element. After the growth current, a set-back current is applied to cause the switch element to be in a low resistance state. Thus, in the example in FIG. 6A, the algorithm ensures that post-read, both the memory and switch elements are in their low resistance states.

Figure 6B:
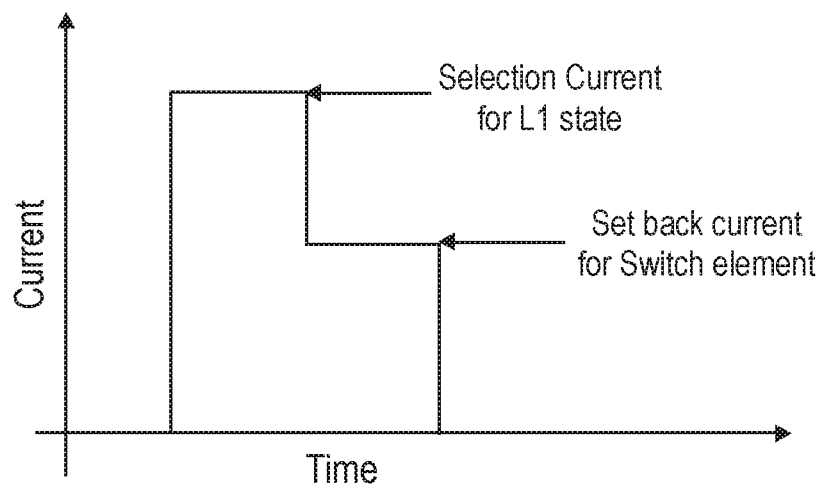
Figure 6C:
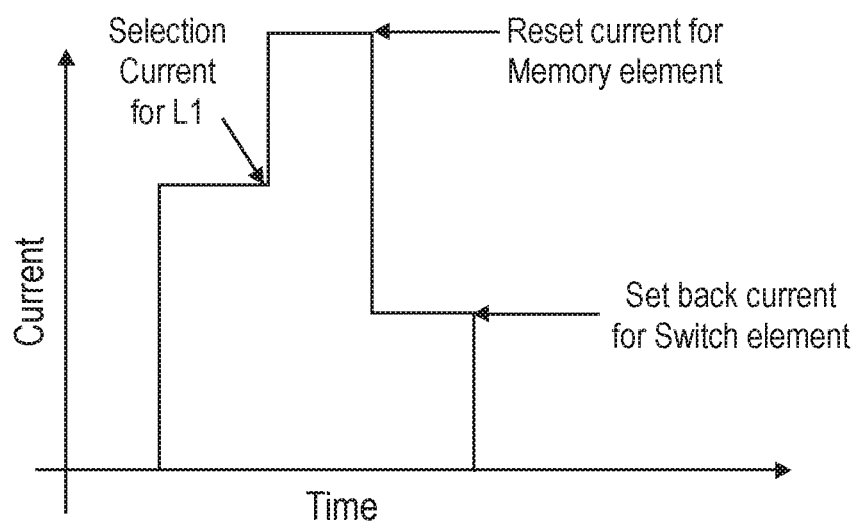

FIGS. 6B and 6C illustrate examples of current waveforms for performing a read operation of a memory cell in the L1 state. In this example, the L1 state corresponds to the switch element being in a low resistance state and the memory element being in a high resistance state. The waveform in FIG. 6B includes a selection current for the L0 state. In one example, the selection current for the L1 state has a magnitude that is greater than the selection current for the L0 state. In the illustrated example, the switch element would be disturbed post-selection. Therefore, referring to FIG. 6B, a set-back current is applied to put the switch element in a low-resistance state after the selection current. In one example, the set back current is a low amplitude and short duration pulse to set back the switch element to a low resistance state while ensuring that memory element does not nucleate.

The waveform in FIG. 6C also includes the selection current for L1 and a set back current for the switch element. However, the waveform in FIG. 6C also includes a write operation in the read algorithm. To eliminate the risk of disturbing the memory element during the read, the write operation can be incorporated into the end of read algorithm (e.g., after the sensing operation) to ensure the bit would not be disturbed.

Figure 6D:
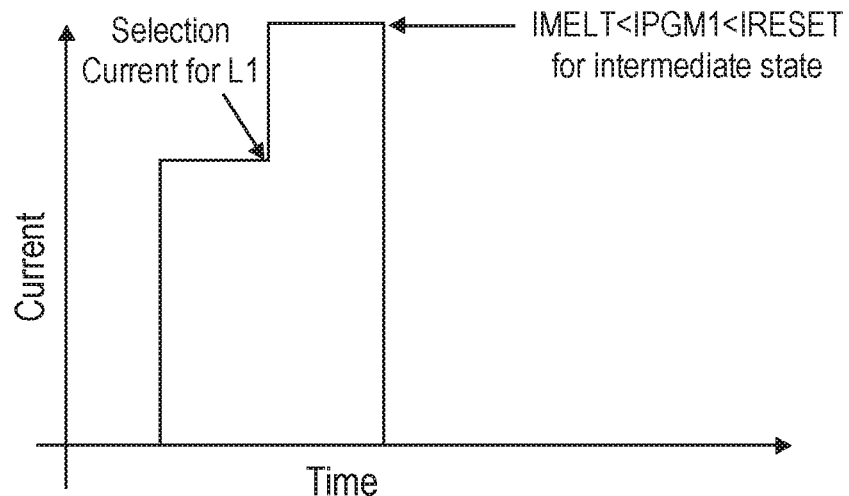

FIG. 6D illustrates an example of a current waveform for performing a read operation of a memory cell in the L1 state, option 2 (L intermediate state). In this example, the L1 state corresponds to the switch element being in an intermediate resistance state and the memory element being in an intermediate resistance state. Like in FIGS. 6B and 6C, the waveform in FIG. 6D includes a selection current for L1. After the selection current, the waveform includes an intermediate current IPGM1 that has a magnitude that is greater than IMELT and less than the reset current. Post selection, both the memory and switch element would be disturbed. Therefore, the same programming current that is used for the write, IPGM1, is applied to the memory cell to place the memory element and switch element into the L1 intermediate resistance states.

Figure 6E:
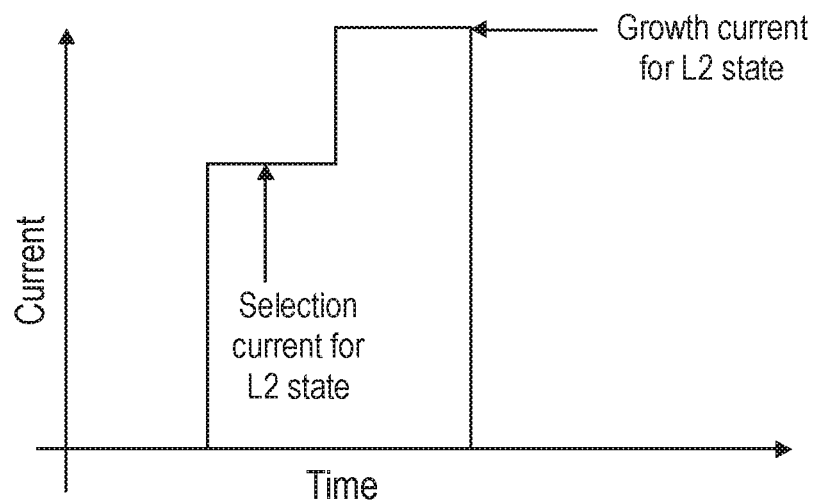

FIG. 6E illustrates an example of a current waveform for performing a read operation of a memory cell in the L2 state, option 1. In this example, the L2 state corresponds to the switch element being in a high resistance stat and the memory element being in a low resistance state. The waveform in FIG. 6E includes a selection current for the L2 state. In one example, the selection current for the L2 state has a magnitude that is greater than the selection current for the L1 state. After the selection current, the waveform includes a growth current for the L2 state. Post selection, the growth current pulse can remedy memory element disturb and ensure that the switch element stays in a reset state.

Figure 6F:
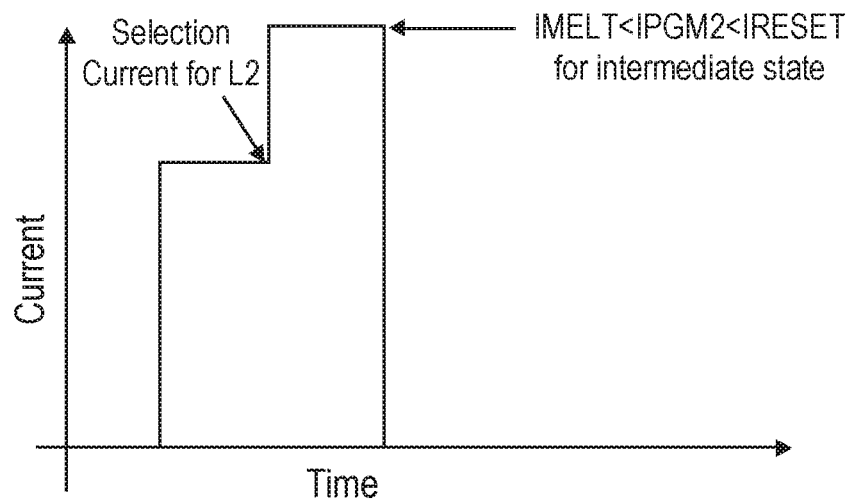

FIG. 6F illustrates an example of a current waveform for performing a read operation of a memory cell in an L2 state, option 2 (L2 intermediate state). In this example, the L2 state corresponds to the switch element being in an second intermediate resistance state and the memory element being in a second intermediate resistance state (relative to the L1 intermediate states). The waveform in FIG. 6F includes a selection current for L2. Post selection, the memory element and the switch element would be disturbed. Therefore, the waveform includes the same programming current as the write operation for state L2, option 2. Accordingly, after the selection current, the waveform includes an intermediate current IPGM2 that has a magnitude that is greater than IMELT and less than the reset current.

Figure 6G:
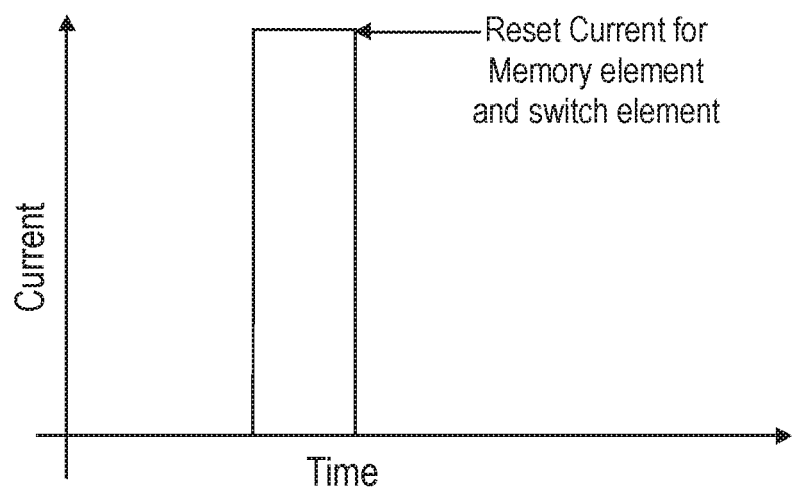

FIG. 6G illustrates an example of a current waveform for performing a read operation of a memory cell in an L3 state. In this example, the VDML2 select/read voltage is applied across the memory cell, and the memory cell does not threshold in response to the voltage. For example, sense circuitry can detect current through the memory cell in response to the VDML2 voltage. If the current through the memory cell is less than a threshold current, then the sense circuitry can determine the memory cell is in the L3 state. The memory cell may not experience read disturb (e.g., due to the high threshold voltage of the memory cell in the L3 state). However, to ensure any read disturb is remedied, a reset current pulse can be applied to the memory cell. Other L3 read algorithms may omit the write operation at the end of the read operation.

Figure 7A:
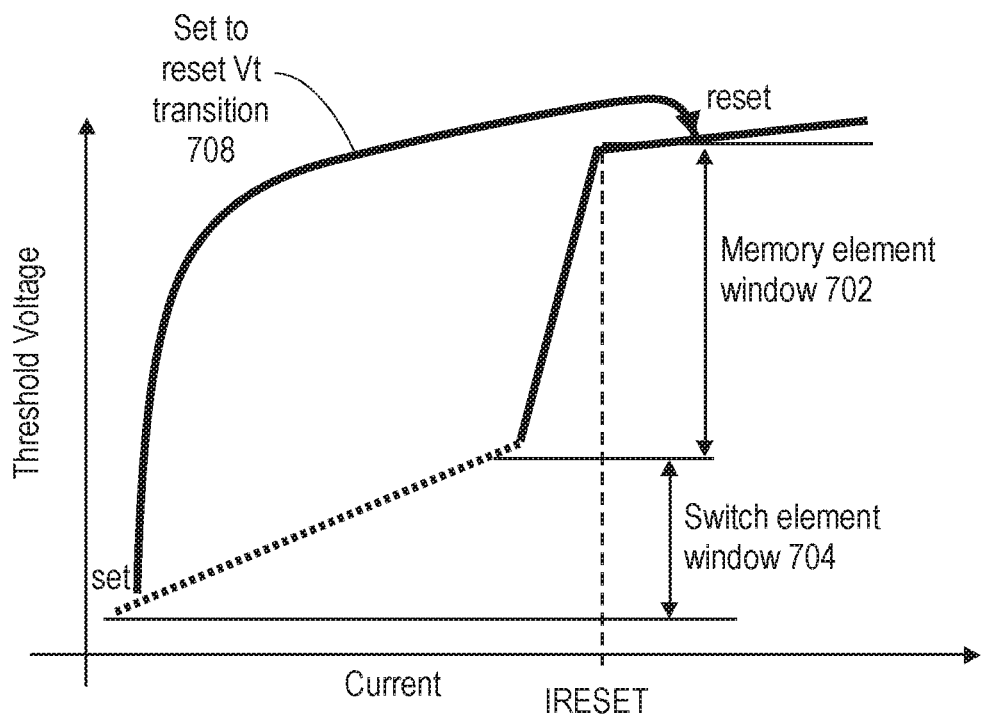
FIG. 7A illustrates an example of a program transfer characteristic diagram of a cross-point memory cell.

FIG. 7A illustrates an example of a program transfer characteristic diagram of a cross-point device. The program transfer characteristic diagram of FIG. 7A shows threshold voltage (y-axis) versus current (x-axis) for a cross-point memory cell in which both the memory element and switch element can be placed in different states corresponding to different threshold voltages. Thus, the program transfer characteristic of FIG. 7A includes a memory element window 702 and a switch element window 704, which can both contribute to the threshold voltage associated with a state of the memory cell. The percentage of the Vt window contributed by the memory element and switch element depends on a number of factors such as the material composition of the memory and switch elements, dimensions of the memory and switch elements, etc. In one example, the contribution to the total VT window from the memory element is greater than the contribution from the switch element. For example, the memory element can contribute approximately 70% or more of the VT window. In another example, the contribution from the memory element and the switch element is approximately equal (e.g., the switch element contributes approximately 50% of the VT window and the memory element contributes approximately 50% of the VT window). In another example, the VT window contribution from the switch element is greater than the contribution from the memory element.

Figure 7B:
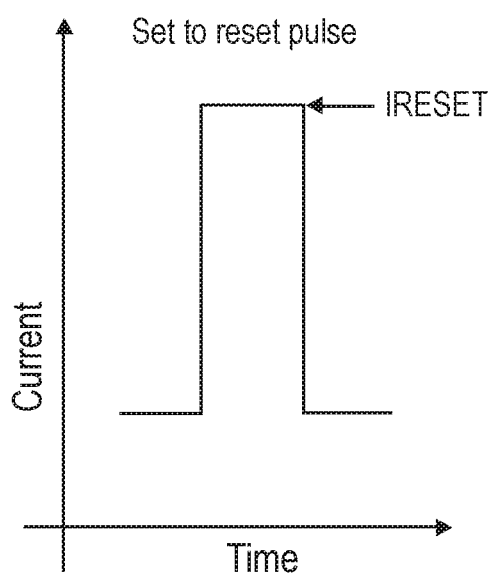
FIG. 7B illustrates an example of a current pulse to cause a memory cell to transition from a set state to a reset state.

A traditional set state corresponds to a low resistance state for both the memory element and switch element. A traditional reset state corresponds to a high resistance state for both the memory element and the switch element. As mentioned above, in an MLC cross-point cell, the set state can correspond to the L0 state and the reset state can correspond to the L3 state. To transition from the set to reset states (as shown by the arrow 708), a high magnitude reset current (e.g., IRESET) is applied to the cell. FIG. 7B illustrates an example of a current pulse to cause a memory cell to transition from a set state to a reset state. Thus, a single pulse that amorphizes the memory element and turns-on the switch element window can be used to transition from the set to reset state for SLC cells, or from the L0 to L3 state for MLC cells with the encoding shown in FIGS. 2A and 2B.

Figure 8A:
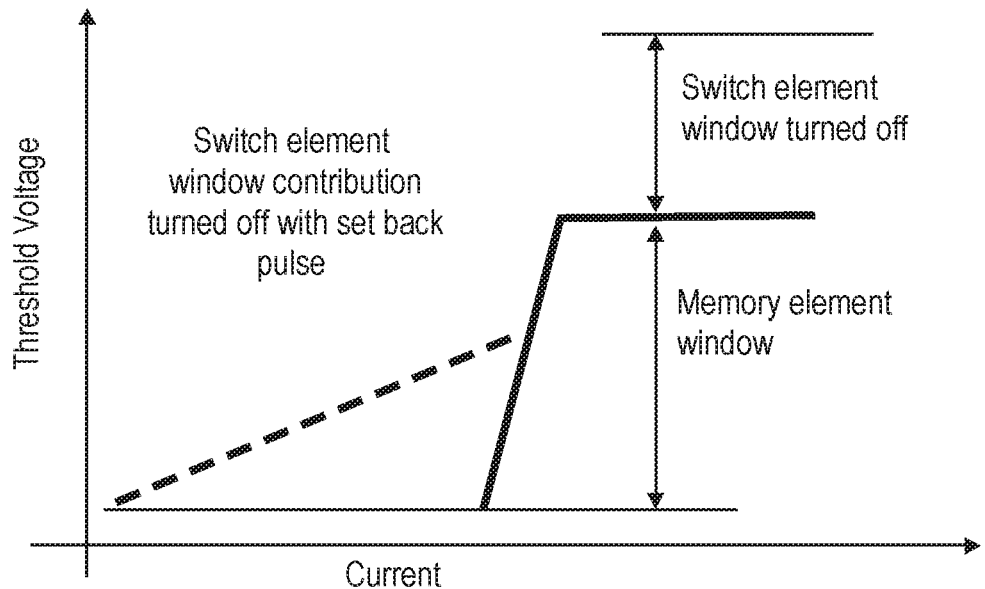
FIG. 8A illustrates an example of a program transfer characteristic diagram of a cross-point memory cell.

FIG. 8A illustrates an example of a program transfer characteristic diagram of a cross-point device in which the switch element VT window contribution is turned off. Unlike in a conventional SLC cross-point memory cell in which the states of the switch element and memory element are either both low resistance or both high resistance, the example in FIG. 8A shows the threshold voltage of a memory cell in which the memory cell is in a high resistance state, but the switch element is in a low resistance state. With the switch element in a low resistance state, the effect or contribution of the switch to the threshold voltage of the memory cell is effectively turned off. Therefore, the threshold voltage exhibited by the memory cell comes primarily from the memory element, and therefore is lower than the threshold voltage exhibited by the memory cell in the reset state. Thus, the state illustrated in FIG. 8A is a third resistance state between the set and reset states. The state illustrated in FIG. 8A corresponds to the L1 state shown in row four of the tables 200A and 200B of FIGS. 2A and 2B. Similarly, another (fourth) state can be achieved between the set and reset states by turning off memory cell's contribution to the threshold voltage exhibited by the memory cell. As discussed above, to program a memory cell to the L1 state in which the switch element is in a low resistance state and the memory element is in a high resistance state, a high reset current pulse followed by a set back current pulse can be applied to the memory cell.

Figure 8B:
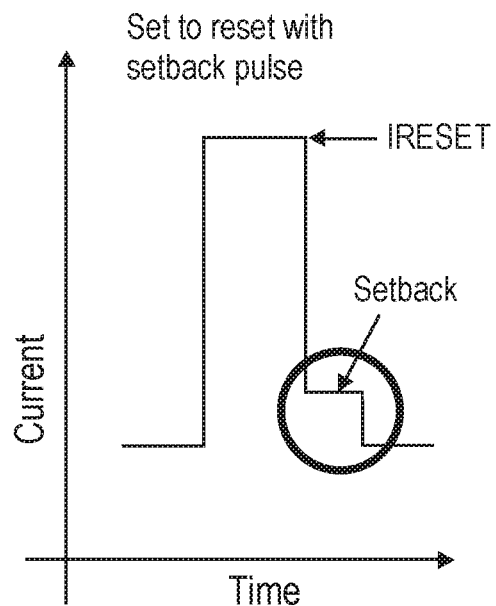
FIG. 8B illustrates an example of a current pulse to place the memory element in the high resistance state and turn off the switch element effect.

FIG. 8B illustrates an example of a current pulse to place the memory element in the high resistance state and turn off the switch element window or effect. The reset pulse has a magnitude of IRESET and causes a phase change of the memory element (e.g., melting of the memory element material) and then quenching it, like the example in FIGS. 7A and 7B. The reset current pulse also turns on the memory effect or the window contribution from the switch element. With the incorporation of setback pulse into the reset pulse, the switch contribution to the window can be turned off, enabling independent control of the switch and memory element windows to create additional states.

Figure 9:
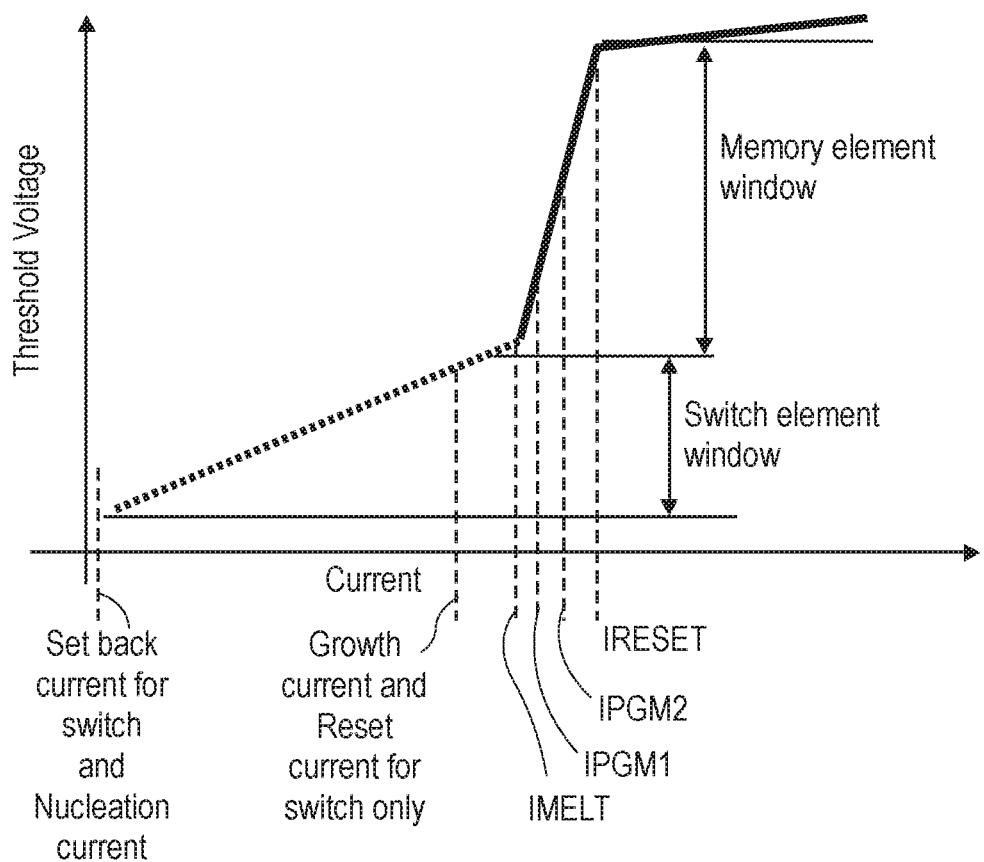
FIG. 9 illustrates a program transfer characteristic diagram of a cross-point device with examples of current amplitudes for causing various state transitions discussed herein.

FIG. 9 illustrates an example of a program transfer characteristic diagram of a cross-point device with an example of current amplitudes for causing the various state transitions discussed herein. The current levels for performing read and write operations may vary based on a number of factors such as the material composition of the memory and switch elements.

As mentioned above, the reset current, IRESET, has a high magnitude that causes both the switch element and the memory element to enter a high resistance reset state. The intermediate currents, IPGM1 and IPGM2, have magnitudes that are less than IRESET and higher than IMELT, the current at which the memory element begins to transition to an amorphous state. The grown current has a magnitude that is less than IMELT. In this example, the reset current for the switch (but not for the memory element) also operates as the growth current for the memory element (see, e.g., FIG. 4G for an example of when the reset current for the switch only may be used). The set back current for the switch element has a magnitude that is lower than the growth current. In this example, the set back current for the switch also operates as a nucleation current for the memory element.

Figure 10:
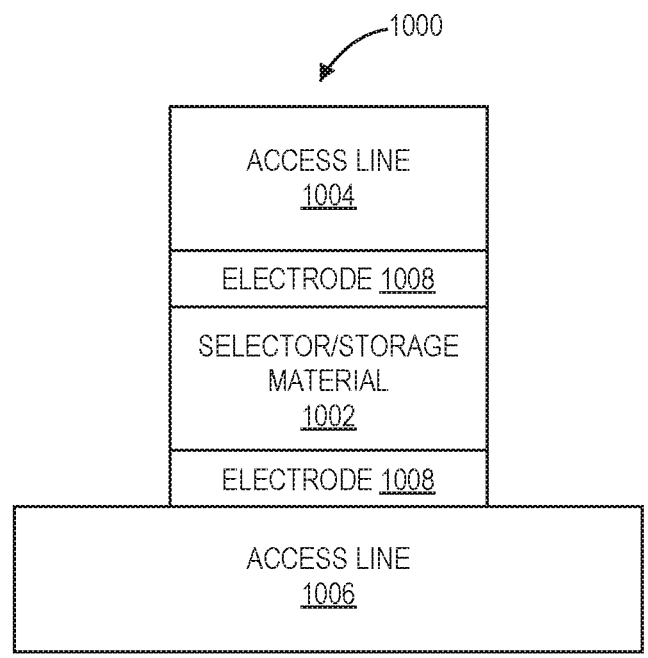
FIG. 10 is an example of a cross-point memory cell.

FIG. 10 illustrates an example of a cross-point memory cell that can be accessed using techniques described herein.

FIG. 10 illustrates a memory cell 1000. The memory cell 1000 includes one or more layers of material 1002 to store data and aid in selection of the memory cell 1000. For example, the memory cell 1000 can include a storage material 1002 (e.g., to form a memory element), a selector material (e.g., to form the switch element), or both, between access lines 1004 and 1006. In one example, the memory cell includes a layer of storage material and a separate layer of selector material. In one example, both the selector and the storage element have tunable threshold voltages. In one example, the memory cell 1000 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple stable states (e.g., via a write operation), and subsequently read back (e.g., via a read operation). In one example, the switch element formed from the select material is an ovonic switch.

The techniques described herein apply generally to cross-point memory and are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the switch element for the ovonic memory. Whether the memory material of the memory cell changes phase or not, in one example, the memory could be referred to as a resistance-based memory. In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials. For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a switch element. The selector material may include a chalcogenide material (e.g., a chalcogenide glass) or other material capable of operating as a selection element. In one example, the selector material includes one or more of: silicon (Si), germanium (Ge), selenium (Se), arsenic (As), tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 1004, 1006 electrically couple the memory cell 100 with circuitry that provides power to and enables access to the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 1004, 1006 can be referred to as a bit line and word line, respectively. The word line is for accessing a particular word in a memory array and the bit line is for accessing a particular bit in the word. The access lines 1004, 1006 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 1008 are disposed between storage material 1002 and access lines 1004, 1006. Electrodes 1008 electrically couple access lines 1004, 1006 with storage material 1002. A memory cell with separate layers of storage and selector material may also include an electrode between the layers of storage and selector material. Electrodes 1008 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 11:
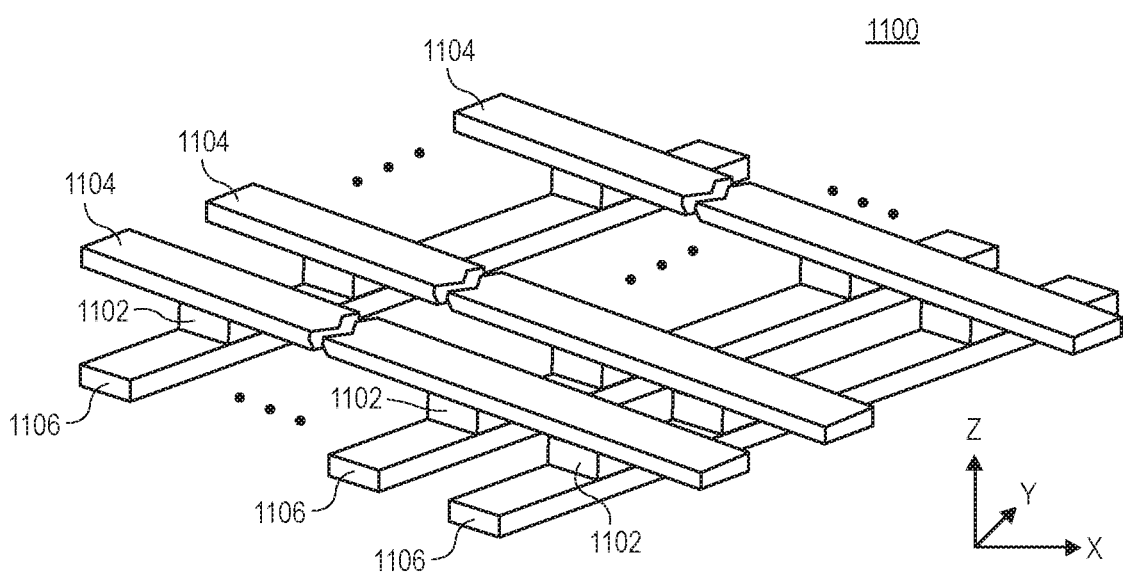
FIG. 11 illustrates an example of a portion of a memory cell array.

FIG. 11 illustrates a portion of a memory cell array 1100, which can include a memory cell such as the memory cell 106 of FIG. 1 or memory cell 1000 of FIG. 10. The memory cell array 1100 is an example of a cross-point memory array. The memory cell array 1100 includes a plurality of access lines 1104, 1106, which can be the same or similar as the access lines 1004, 1006 described with respect to FIG. 10. Access lines 1104, 1106 can be referred to as bit lines and word lines. In the example illustrated in FIG. 11, the bit lines (e.g., access lines 1104) are orthogonal to the word lines (e.g., access lines 1106). A storage material 1102 is disposed between the access lines 1104, 1106. In one example, a "cross-point" is formed at an intersection between a bit line and a word line. A memory cell is created from the storage material 1102 between the bit line and word line where the bit line and word line intersect. The storage material 1102 can be a chalcogenide material, phase change material, both a chalcogenide material and phase change material, or other storage material. In one example, the access lines 1104, 1106 are composed of one or more conductive materials such as the access lines 1004, 1006 described above with respect to FIG. 10.

Although a single level or tier of memory cells is shown in FIG. 11 for the sake of clarity, memory cell array 1100 typically includes multiple levels or tiers of non-volatile memory cells (e.g., in the z-direction). Nonvolatile memory devices including multiple tiers of cross-point memory cells may be referred to as three-dimensional (3D), multi-level, or multi-tiered cross-point memory devices. The FIGS. 10 and 11 illustrate an example of a memory cell and array in which the MLC techniques described herein may be implemented. However, the techniques described herein can be implemented in memory cell structures and arrays having different materials or structures than the examples described in FIGS. 10 and 11.

Figure 12:
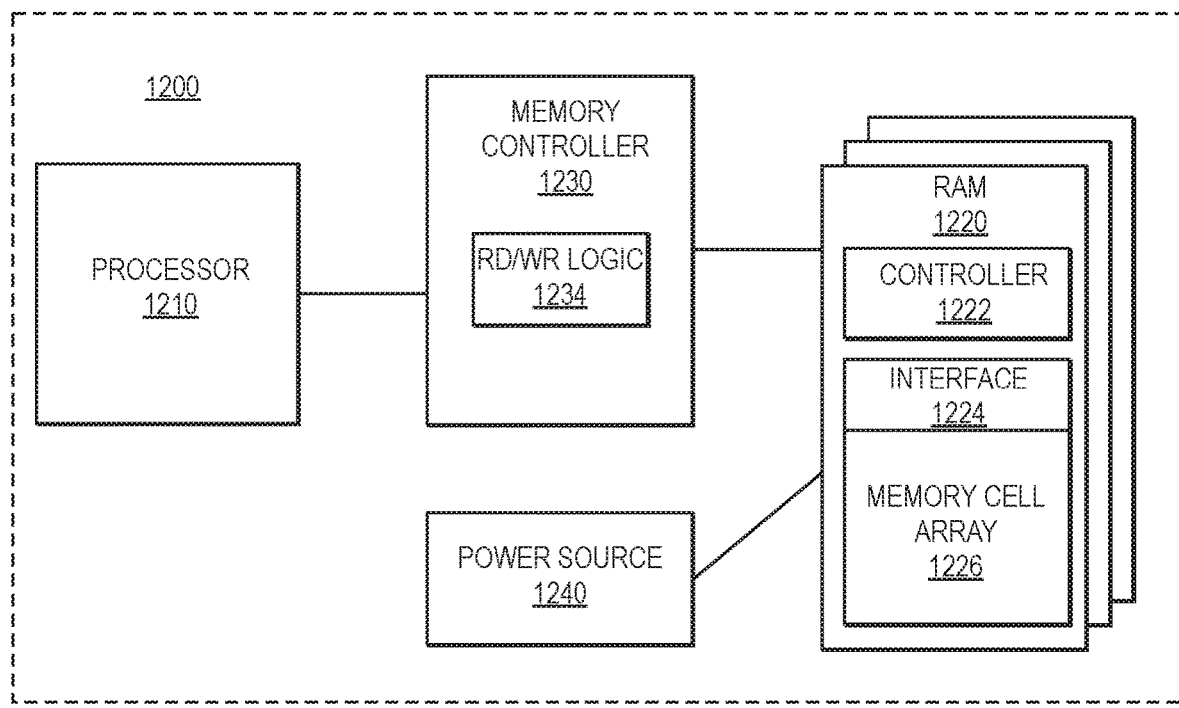
FIG. 12 is a block diagram of a system that can include a non-volatile memory device that implements MLC access techniques described herein.

FIG. 12 is a block diagram of a system that can include a non-volatile memory device in accordance with examples described herein.

System 1200 includes components of a memory subsystem having random access memory (RAM) 1220 to store and provide data in response to operations of processor 1210. The system 1200 receives memory access requests from a host or a processor 1210, which is processing logic that executes operations based on data stored in RAM 1220 or generates data to store in RAM 1220. The processor 1210 can be or include a host processor, central processing unit (CPU), microcontroller or microprocessor, graphics processor, peripheral processor, application specific processor, or other processor, and can be single core or multicore.

The system 1200 includes a memory controller 1230 (e.g., host memory controller), which represents logic to interface with RAM 1220 and manage access to data stored in the memory. In one example, the memory controller 1230 is integrated into the hardware of processor 1210. In one example, the memory controller 1230 is standalone hardware, separate from the processor 1210. The memory controller 1230 can be a separate circuit on a substrate that includes the processor. The memory controller 1230 can be a separate die or chip integrated on a common substrate with a processor die (e.g., as a system on a chip (SoC)). In one example, the memory controller 1230 is an integrated memory controller (iMC) integrated as a circuit on the processor die. In one example, at least some of RAM 1220 can be included on an SoC with the memory controller 1230 and/or the processor 1210.

In the illustrated example, the memory controller 1230 includes read/write logic 1234, which includes hardware to interface with the RAM 1220. The logic 1234 enables the memory controller 1230 to generate read and write commands to service requests for data access generated by the execution of instructions by processor 1210.

The memory resources or cachelines in the RAM 1220 are represented by a memory cell array 1226, which can include a cross-point array. The RAM 1220 includes an interface 1224 (e.g., interface logic) to control the access to the memory device array 1226. The interface 1224 can include decode logic, including logic to address specific rows or columns, bit lines or word lines, or otherwise address specific bits of data. The controller 1222 represents an on-die (e.g., on the same die as the memory array) or on-package (e.g., in the same package as the memory array) controller on RAM 1220 to control its internal operations to execute commands received from memory controller 1230. For example, the controller 1222 can control any of timing, voltage levels, addressing, I/O (input/output) margining, scheduling, and error correction for RAM 1220.

In one example, the controller 1222 is configured to read and write to the memory device array 1226 in accordance with any example described herein. A power source 1240 is connected to the RAM 1220 to provide one or more voltage rails for operation of the RAM 1220.

Figure 13:
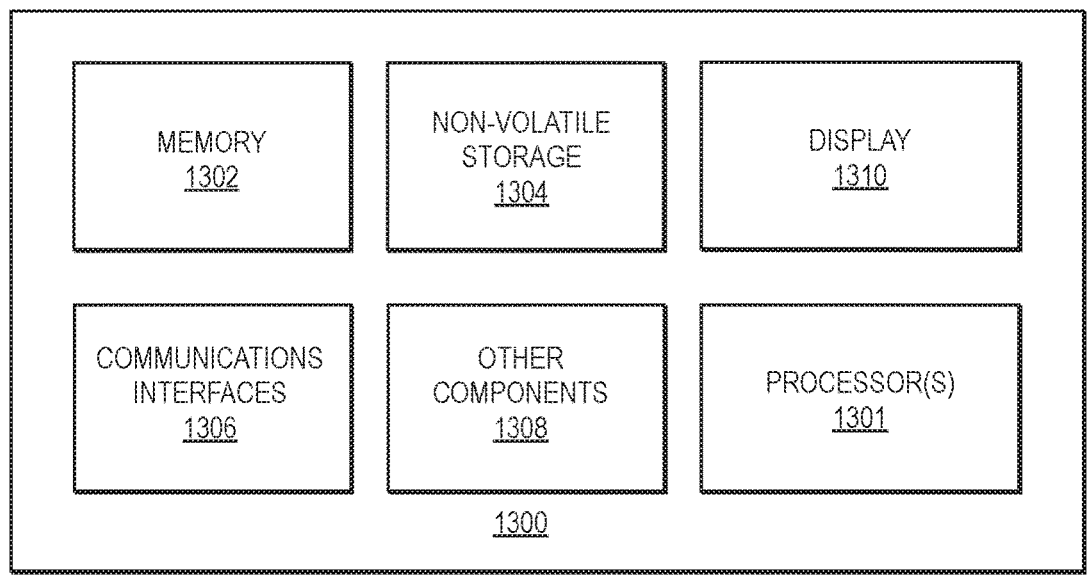
FIG. 13 provides an exemplary depiction of a computing system that can include a non-volatile memory device that implements MLC access techniques described herein.

FIG. 13 provides an exemplary depiction of a computing system 1300 (e.g., a smartphone, a tablet computer, a laptop computer, a desktop computer, a server computer, etc.). As observed in FIG. 13, the system 1300 may include one or more processors or processing units 1301. The processor(s) 1301 may include one or more central processing units (CPUs), each of which may include, e.g., a plurality of general-purpose processing cores. The processor(s) 1301 may also or alternatively include one or more graphics processing units (GPUs) or other processing units. The processor(s) 1301 may include memory management logic (e.g., a memory controller) and I/O control logic. The processor(s) 1301 can be similar to, or the same as, the processor 1210 of FIG. 12.

The system 1300 also includes memory 1302 (e.g., system memory), non-volatile storage 1304, communications interfaces 1306, a display 1310 (e.g., touchscreen, flat-panel), and other components 1308. The other components may include, for example, a power supply (e.g., a battery or/or other power supply), sensors, power management logic, or other components. The communications interfaces 1306 may include logic and/or features to support a communication interface. For these examples, communications interface 1306 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1304, which may be the mass storage component of the system. The non-volatile storage 1304 can be similar to, or the same as, the RAM 1220 of FIG. 12, described above. Non-volatile storage 1304 may include byte or block addressable types of non-volatile memory having a cross-point memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 1304 may include mass storage that is composed of one or more SSDs (solid state drives), DIMMs (dual in line memory modules), or other module or drive. The non-volatile storage 1304 may implement techniques in accordance with examples described herein.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
    an array of cross-point memory cells, each of the cross-point memory cells including a memory element and a switch element; and
    circuitry to independently set a state of the memory element and a state of the switch element of a cross-point memory cell of the array to program the cross-point memory cell to one of multiple logic values;
    the multiple logic values including:
        a first logic value corresponding to a low magnitude threshold voltage and a low resistance state of both the memory element and the switch element,
        a second logic value corresponding to a high magnitude threshold voltage and a high resistance state of both the memory element and the switch element of the cross-point memory cell, and
        a third logic value corresponding to an intermediate threshold voltage having a magnitude that is less than the high magnitude threshold voltage and greater than the low magnitude threshold voltage.

2. The memory device of claim 1, wherein:
    the third logic value corresponds to the high resistance state of the memory element and the low resistance state of the switch element.

3. The memory device of claim 1, wherein:
    the third logic value corresponds to an intermediate resistance state of the memory element and an intermediate resistance state of switch element.

4. The memory device of claim 2, wherein the multiple logic values include:
    a fourth logic value that corresponds to the low resistance state of the memory element and the high resistance state of the switch element.

5. The memory device of claim 3, wherein the multiple logic values include:
    a fourth logic value that corresponds to a second intermediate resistance state of the memory element and a second intermediate state of the switch element.

6. The memory device of claim 2, wherein the circuitry is to program the cross-point memory cell to the third logic value, including to:
    after a determination that the memory element is in the high resistance state, apply a current to the cross-point memory cell to cause the switch element to be in the low resistance state.

7. The memory device of claim 6, wherein the circuitry to program the cross-point memory cell to the third logic value is to:
    determine a resistance state of the memory element prior to programming; and
    if the memory element is in the low resistance state prior to programming:
        prior to application of the current to cause the switch element to be in the low resistance state, apply a higher magnitude current to cause the memory element to be in the high resistance state.

8. The memory device of claim 3, wherein the circuitry is to program the cross-point memory cell to the third logic value, including to:
    apply a current to the cross-point memory cell to cause the switch element and the memory element to be to the intermediate resistance state.

9. The memory device of claim 4, wherein the circuitry is to program the cross-point memory cell to the fourth logic value, including to:
    after a determination that the memory element is in the low resistance state, apply a current to the cross-point memory cell to cause the switch element to be in the high resistance state.

10. The memory device of claim 9, wherein the circuitry to program the cross-point memory cell to the fourth logic value is to:
    determine a resistance state of the memory element prior to programming; and
    if the memory element is in the high resistance state prior to programming:
        prior to application of the current to cause the switch element to be in the high resistance state, apply a lower magnitude current to cause the memory element to be in the low resistance state.

11. The memory device of claim 5, wherein the circuitry is to program the cross-point memory cell to the fourth logic value, including to:
    apply a current to the cross-point memory cell to cause the switch element and the memory element to be in the second intermediate resistance state; and
    wherein the current has a magnitude that is less than the current to cause the memory element to be in a high resistance state.

12. The memory device of claim 1, wherein:
    the circuitry is to read the cross-point memory cell, including to:
        in response to determining the cross-point memory cell stores the first logic value or the third logic value, apply a current to cause the switch element to be in a low resistance state.

13. The memory device of claim 3, wherein:
    the circuitry is to read the cross-point memory cell, including to:
        in response to determining the cross-point memory cell stores the third logic value, apply a current to cause the switch element and the memory element to be in the intermediate resistance state.

14. The memory device of claim 4, wherein:
    the circuitry is to read the cross-point memory cell, including to:
        in response to determining the cross-point memory cell stores the fourth logic value, apply a current to cause the memory element to be in the low resistance state.

15. The memory device of claim 5, wherein:
    the circuitry is to read the cross-point memory cell, including to:

in response to determining the cross-point memory cell stores the fourth logic value, apply a current to cause the switch element and the memory element to be in the second intermediate resistance state.

16. The memory device of claim 1, wherein:
the memory element includes one or both of a phase change material and a chalcogenide material.

17. The memory device of claim 1, wherein:
the switch element includes a chalcogenide material.

18. A circuit comprising:
input/output circuitry to receive a command to access a cross-point memory cell, the cross-point memory cell including a memory element and a switch element;
circuitry to: in response to the command, independently set a state of the memory element and a state of the switch element to program the cross-point memory cell to one of multiple logic values;
the multiple logic values including:
  a first logic value corresponding to a low magnitude threshold voltage and a low resistance state of both the memory element and the switch element,
  a second logic value corresponding to a high magnitude threshold voltage and a high resistance state of both the memory element and the switch element of the cross-point memory cell, and
  a third logic value corresponding to an intermediate threshold voltage having a magnitude that is less than the high magnitude threshold voltage and greater than the low magnitude threshold voltage and the high resistance state of the memory element and the low resistance state of the switch element.

19. A system comprising:
a memory controller; and
a memory die in a same package as the memory controller, the memory die comprising:
  an array of cross-point memory cells, each of the cross-point memory cells including a memory element and a switch element; and
  circuitry to;
    independently set a state of the memory element and a state of the switch element of a cross-point memory cell of the array to program the cross-point memory cell to one of multiple logic values;
  the multiple logic values including:
    a first logic value corresponding to a low magnitude threshold voltage,
    a second logic value corresponding to a high magnitude threshold voltage, and
    a third logic value corresponding to an intermediate threshold voltage having a magnitude that is less than the high magnitude threshold voltage and greater than the low magnitude threshold voltage, and
  read the cross-point memory cell, including to:
    in response to a determination that the cross-point memory cell stores the first logic value or the third logic value, apply a current to cause the switch element to be in a low resistance state.

20. The system of claim 19, further comprising:
one or more of a processor, a host memory controller, a display, and a power source.

21. The circuit of claim 18, wherein:
the circuitry is to read the cross-point memory cell, including to:
  in response to a determination that the cross-point memory cell stores the first logic value or the third logic value, apply a current to cause the switch element to be in a low resistance state.

22. The system of claim 19, wherein:
the first logic value corresponds to a low resistance state of both the memory element and the switch element; and
the second logic value corresponds to a high resistance state of both the memory element and the switch element of the cross-point memory cell.

* * * * *